US006995617B2

(12) United States Patent
Citta et al.

(10) Patent No.: US 6,995,617 B2
(45) Date of Patent: Feb. 7, 2006

(54) DATA-DIRECTED FREQUENCY-AND-PHASE LOCK LOOP

(75) Inventors: Richard W. Citta, Oak Park, IL (US); Scott M. LoPresto, Mount Prospect, IL (US); Jingsong Xia, Mundelein, IL (US); Wenjun Zhang, Shanghai (CN)

(73) Assignee: Micronas Semiconductors, Inc., Palatine, IL (US)

( * ) Notice: Subject to any disclaimer, the term of this patent is extended or adjusted under 35 U.S.C. 154(b) by 217 days.

(21) Appl. No.: 10/404,511

(22) Filed: Apr. 1, 2003

(65) Prior Publication Data
US 2003/0215044 A1 Nov. 20, 2003

Related U.S. Application Data

(60) Provisional application No. 60/370,295, filed on Apr. 5, 2002, provisional application No. 60/370,283, filed on Apr. 5, 2002, and provisional application No. 60/370,296, filed on Apr. 5, 2002.

(51) Int. Cl.
*H03L 7/00* (2006.01)

(52) U.S. Cl. .......................... 331/1 A; 331/16; 331/17; 331/25; 375/376

(58) Field of Classification Search ............... 331/1 A, 331/16, 17, 25; 375/376, 232
See application file for complete search history.

(56) References Cited

U.S. PATENT DOCUMENTS

| 4,072,909 | A | 2/1978 | Citta |
|---|---|---|---|
| 4,567,599 | A | 1/1986 | Mizoguchi |
| 4,712,221 | A | 12/1987 | Pearce et al. |
| 4,815,103 | A | 3/1989 | Cupo et al. |
| 4,833,693 | A | 5/1989 | Eyuboglu |
| 4,856,031 | A | 8/1989 | Goldstein |
| 4,866,395 | A | 9/1989 | Hostetter |
| 4,989,090 | A | 1/1991 | Campbell et al. |
| 5,052,000 | A | 9/1991 | Wang et al. |

(Continued)

FOREIGN PATENT DOCUMENTS

| EP | 0524559 B1 | 5/1997 |
|---|---|---|
| EP | 0752185 B1 | 7/2002 |
| WO | WO 00/27033 | 5/2000 |
| WO | WO 00/27066 | 5/2000 |
| WO | WO 01/13516 A2 | 2/2001 |
| WO | WO 01/43310 A2 | 6/2001 |
| WO | WO 01/43384 A2 | 6/2001 |

OTHER PUBLICATIONS

Demodulation of Cochannel QAM Signals (continued); Error Detection/Correction; pp. 1–3, http://www.appsig.com/papers/1813f/813f 4.html.
Demodulation of Cochannel QAM Signals (continued); Simulation Results; pp. 1–6; http://www.appsig.com/papers/1813f/813f 5.html.
De Haan et al. "DeInterlacing–an Overview", Proceedings of the IEEE, vol. 86, No. 9, pp. 1837–1856 (Sep. 1998).
De Haan et al. "De–Interlacing of Video Data", IEEE Transactions on Consumer Electronics, vol. 43, No. 3, pp. 819–824 (Aug. 1997).
Wang et al. "Time–Recursive DeInterlacing for IDTV and Pyramid Coding", Elsevier Science Publishers B. V., vol. 2, No. 3, pp. 365–374 (Oct. 1990).

*Primary Examiner*—Michael B Shingleton
(74) *Attorney, Agent, or Firm*—O'Shea, Getz & Kosakowski, P.C.

(57) ABSTRACT

A data-directed frequency-and-phase lock loop for an offset-QAM modulated signal comprises a first multiplier that multiplies the signal by the output of a VCO. The output of the first multiplier is phase-shifted by a second multiplier, then convolved by a third multiplier. The output of the third multiplier is split, with each portion being passed through a frequency-shift multiplier and a frequency-and-phase lock loop. The output of the two frequency-and-phase lock loops is summed and returned to the VCO to complete the feedback loop.

16 Claims, 7 Drawing Sheets

U.S. PATENT DOCUMENTS

| | | | |
|---|---|---|---|
| 5,056,117 A | 10/1991 | Gitlin et al. | |
| 5,058,047 A | 10/1991 | Chung | 364/724.19 |
| 5,127,051 A | 6/1992 | Chan et al. | |
| 5,134,480 A | 7/1992 | Wang et al. | |
| 5,142,551 A | 8/1992 | Borth et al. | |
| 5,210,774 A | 5/1993 | Abbiate et al. | |
| 5,278,780 A | 1/1994 | Eguchi | 364/724.19 |
| 5,311,546 A | 5/1994 | Paik et al. | |
| 5,453,797 A | 9/1995 | Nicolas et al. | |
| 5,471,508 A | 11/1995 | Koslov | |
| 5,506,636 A | 4/1996 | Patel et al. | |
| 5,508,752 A | 4/1996 | Kim et al. | |
| 5,532,750 A | 7/1996 | De Haan et al. | |
| 5,537,435 A | 7/1996 | Carney et al. | |
| 5,568,098 A | 10/1996 | Horie et al. | |
| 5,568,521 A | 10/1996 | Williams et al. | |
| 5,588,025 A | 12/1996 | Strolle et al. | |
| 5,619,154 A | 4/1997 | Strolle et al. | |
| 5,648,987 A | 7/1997 | Yang et al. | |
| 5,668,831 A * | 9/1997 | Claydon et al. | 375/232 |
| 5,692,014 A | 11/1997 | Basham et al. | |
| 5,757,855 A | 5/1998 | Strolle et al. | |
| 5,781,463 A | 7/1998 | Ogawa et al. | 364/724.19 |
| 5,789,988 A | 8/1998 | Sasaki | |
| 5,802,461 A | 9/1998 | Gatherer | |
| 5,805,242 A | 9/1998 | Strolle et al. | |
| 5,828,705 A | 10/1998 | Kroeger et al. | |
| 5,835,532 A | 11/1998 | Strolle et al. | |
| 5,862,156 A | 1/1999 | Huszar et al. | |
| 5,870,433 A | 2/1999 | Huber et al. | |
| 5,872,817 A | 2/1999 | Wei | |
| 5,877,816 A | 3/1999 | Kim | |
| 5,894,334 A | 4/1999 | Strolle et al. | |
| 5,995,154 A | 11/1999 | Heimburger | |
| 6,005,640 A | 12/1999 | Strolle et al. | |
| 6,012,421 A | 1/2000 | Kusche et al. | |
| 6,034,734 A | 3/2000 | De Haan et al. | |
| 6,034,998 A | 3/2000 | Takashi et al. | |
| 6,044,083 A | 3/2000 | Citta et al. | |
| 6,069,524 A | 5/2000 | Mycynek et al. | |
| 6,133,785 A | 10/2000 | Bourdeau | |
| 6,133,964 A | 10/2000 | Han | |
| 6,141,384 A | 10/2000 | Wittig et al. | |
| 6,145,114 A | 11/2000 | Crozier et al. | |
| 6,154,487 A | 11/2000 | Murai et al. | |
| 6,178,209 B1 | 1/2001 | Hulyalkar et al. | |
| 6,195,400 B1 | 2/2001 | Maeda | |
| 6,219,379 B1 | 4/2001 | Ghosh | |
| 6,222,891 B1 | 4/2001 | Liu et al. | |
| 6,226,323 B1 | 5/2001 | Tan et al. | |
| 6,233,286 B1 | 5/2001 | Wei | |
| 6,240,133 B1 | 5/2001 | Sommer et al. | |
| 6,249,544 B1 | 6/2001 | Azazzi et al. | |
| 6,260,053 B1 | 7/2001 | Maulik et al. | |
| 6,272,173 B1 | 8/2001 | Hatamian | |
| 6,275,554 B1 | 8/2001 | Bouillet et al. | |
| 6,278,736 B1 | 8/2001 | De Haan et al. | |
| 6,304,614 B1 | 10/2001 | Abbaszadeh et al. | |
| 6,307,901 B1 | 10/2001 | Yu et al. | |
| 6,333,767 B1 | 12/2001 | Patel et al. | |
| 6,356,586 B1 | 3/2002 | Krishnamoorthy et al. | |
| 6,363,124 B1 | 3/2002 | Cochran | |
| 6,411,341 B1 | 6/2002 | De Haan et al. | |
| 6,411,659 B1 | 6/2002 | Liu et al. | |
| 6,415,002 B1 | 7/2002 | Edwards et al. | |
| 6,421,378 B1 | 7/2002 | Fukuoka et al. | |
| 6,438,164 B2 | 8/2002 | Tan et al. | |
| 6,452,639 B1 | 9/2002 | Wagner et al. | |
| 6,466,630 B1 | 10/2002 | Jensen | |
| 6,483,872 B2 | 11/2002 | Nguyen | 375/231 |
| 6,490,007 B1 | 12/2002 | Bouillet et al. | |
| 6,493,409 B1 | 12/2002 | Lin et al. | |
| 6,507,626 B1 | 1/2003 | Limberg | |
| 6,535,553 B1 | 3/2003 | Limberg et al. | |
| 6,570,919 B1 | 5/2003 | Lee | |
| 6,573,948 B1 | 6/2003 | Limberg | 348/614 |
| 6,611,555 B2 | 8/2003 | Smith et al. | |
| 6,665,695 B1 | 12/2003 | Brokish et al. | 708/322 |
| 6,665,696 B2 | 12/2003 | Brokish | 708/322 |
| 6,724,844 B1 | 4/2004 | Ghosh | |
| 6,734,920 B2 | 5/2004 | Ghosh et al. | |
| 2001/0048723 A1 | 12/2001 | Oh | |
| 2002/0024996 A1 | 2/2002 | Agazzi et al. | |
| 2002/0051498 A1 | 5/2002 | Thomas et al. | |
| 2002/0136329 A1 | 9/2002 | Liu et al. | |
| 2002/0154248 A1 | 10/2002 | Wittig et al. | |
| 2002/0172275 A1 | 11/2002 | Birru | |
| 2002/0172276 A1 | 11/2002 | Tan et al. | |
| 2002/0186762 A1 | 12/2002 | Xia et al. | |
| 2002/0191716 A1 | 12/2002 | Xia et al. | |
| 2003/0058967 A1 | 3/2003 | Lin et al. | |
| 2003/0206600 A1 | 11/2003 | Vankka | |
| 2004/0057538 A1 | 3/2004 | Sathiavageeswaran et al. | |

* cited by examiner

DATA-DIRECTED FREQUENCY-AND-PHASE LOCK LOOP

CLAIM OF PRIORITY

This utility patent application claims priority to U.S. Provisional Patent Applications Nos. 60/370,295, 60/370,283, and 60/370,296 all filed Apr. 5, 2002 the entire specifications of which are hereby incorporated herein.

BACKGROUND

In order to provide the widest possible coverage for a digital transmission, such as for cell phones or a digital television broadcast, it's desirable to use multiple transmitters that are separated from each other spatially. This permits a wider area to be covered, uses less total broadcast power, and can help to fill in dark areas where the transmission from one transmitter may be blocked. Thus, using multiple transmitters can provide wider and more complete coverage for virtually any digital transmission.

However, using multiple transmitters creates a serious problem when the receiver is at a "seam" between two transmitters, because the additional signal can appear as a "ghost" that can be as large as the "main" signal. Furthermore, destructive interference creates a series of perfect or near perfect nulls.

Existing receiver technology handles ghosts by filtering them out in order to interpret the "main" signal. But in a multi-transmitter environment this strategy is unworkable. It makes little sense to design a system to filter out a ghost that can be an arbitrarily large fraction of the "main" signal's size. Furthermore, near the margins the best this subtractive strategy can ever provide is a signal strength equal to the stronger transmitter's signal—the energy from the secondary signal is wasted.

Even when the ghosts are smaller than 100% of the "main" signal, there is an equal probability of pre- and post-ghosts. In the most common situation, the strongest signal is the one following the most direct path. Ghosts are most often produced by "multipathing," that is, by portions of the signal following paths of different lengths from the transmitter to the receiver. Thus, ghosts are typically produced by one or more strong reflections. The first signal to arrive is typically the most direct, and therefore the strongest, and so in the usual situation the ghost is a post-ghost. In a multi-transmitter environment, though, while the receiver is near a seam the stronger signal can easily arrive after the ghost. With signals arriving from two directions, it is possible that the more direct path may be the longer one. Consequently, pre-ghosts are about as likely as post-ghosts, and may be arbitrarily strong. Furthermore, if the transmitters are out of sync with each other by even a small amount, where the one lagging happens to be the closer one the receiver will likely see pre-ghosts.

Existing technology relies on the assumption that post-ghosts predominate (i.e., existing systems are not generally designed to deal with Raleigh fading). Thus, existing receivers generally will be either inefficient or incapable of dealing with a multi-transmitter environment, even if the ghosts are sufficiently small compared to the "main" signal.

In short, in a multi-transmitter environment, the "main" signal becomes a meaningless concept at the seams of the transmission. In order to operate efficiently in a multi-transmitter environment, a digital receiver must operate with a different paradigm. What is needed is a digital receiver that employs an additive strategy—that is, one in which the energy from one or more relatively large ghosts can be captured and used to aid in the synchronization process, rather than filtered out and discarded. Such a receiver could both function with ghosts 100% of the size of the "main" signal, and provides substantially superior performance whenever ghosts exceed about 70% of the size of the "main" signal.

From the receiver's perspective, most of the signal is useless for synchronization, because it is indistinguishable from white noise. The more information that is packed into a signal, the more closely it will resemble white noise, so this is both a desirable and inevitable feature of the signal. Nevertheless, some bandwidth must be "wasted" in order to provide the receiver a means to orient itself. Typically, one of two strategies is employed. In some systems, a pilot signal is included. This is a sharp peak of energy in a very narrow frequency band, which is very easy for the receiver to pick out.

Figure 1:
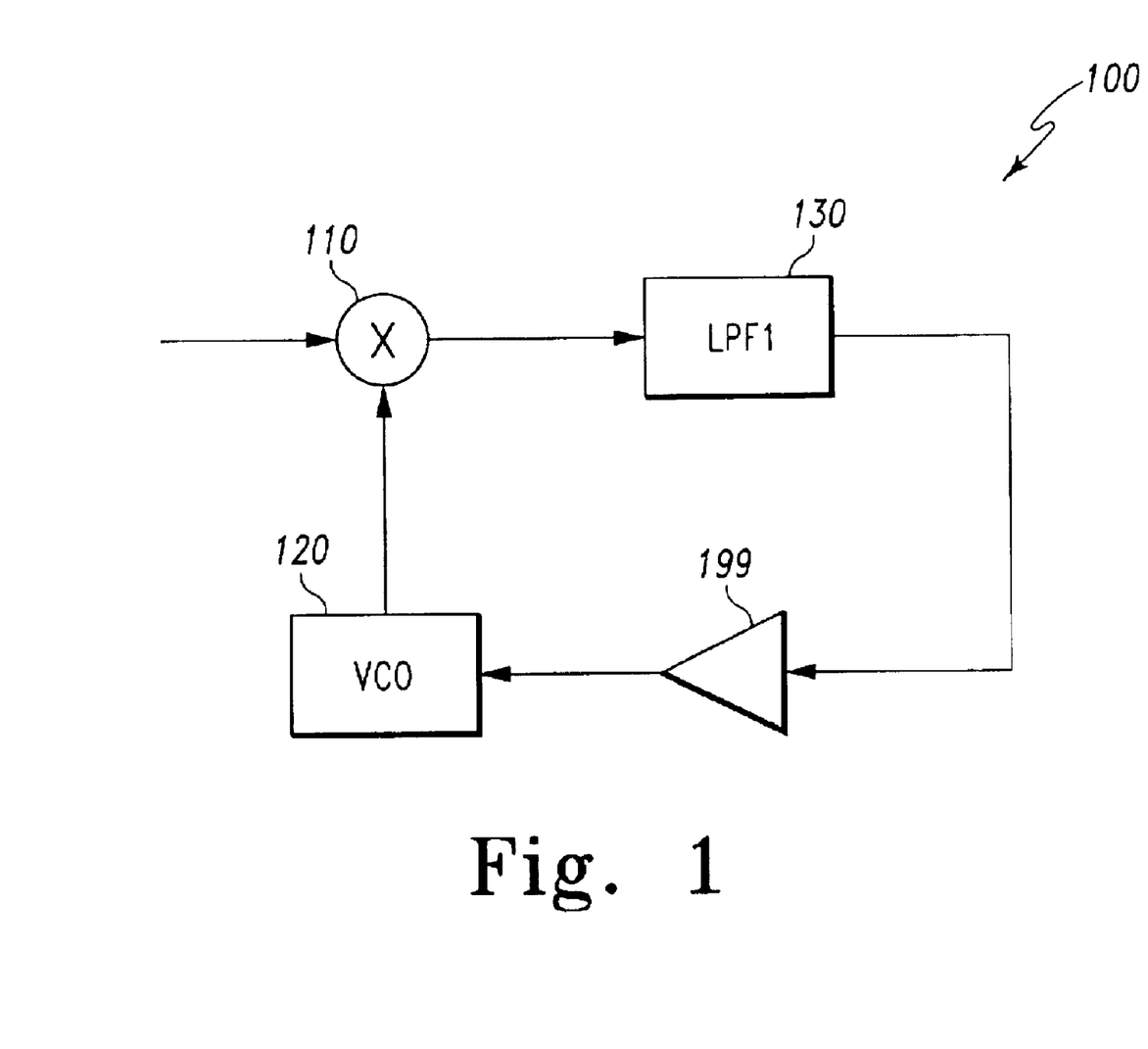
FIG. 1 is a prior art phase lock loop.

A phase-lock loop, such as the one shown in FIG. 1, indicated generally at 100, is a typical way to synch up a receiver using a pilot. A multiplier 110 multiplies the signal and the output of a voltage controlled oscillator 120 ("VCO") to produce a beat note (a sine wave with a frequency equal to the difference between the frequency of the pilot signal and the VCO's output). The beat note passes through a low-pass filter 130. The output of the filter 130 is amplified at 199 and input to the VCO 120 to complete the feedback loop. The low-pass filter 130 has competing design parameters. The more narrow the band pass of the filter 130 the smaller the response, so the slower the loop 100 is to lock up. However, a wide pass filter passes more noise and makes it harder for the loop 100 to capture at all.

It will be appreciated that the response of the loop 100 is driven by the frequency difference output of the first multiplier 110. The direction of error can only be determined by observing the slope of the time rate of change of the output. The second filter 130 distorts the sine wave, increasing the amplitude on the closer side, and decreasing it on the further side. Convergence is driven by this asymmetry of the distorted beat note.

However, because the amplitude of the beat note drops with increasing frequency difference, that distortion output drops as well, so the response of the phase-lock loop 100 decreases as the frequency of the VCO 120 diverges from the signal frequency. Thus, unless the signal happens to be close to the initial VCO 120 frequency, it will converge slowly, or not at all. A typical phase lock loop can capture when the initial VCO 120 frequency is within a factor of about 3–10 times the bandwidth of the loop.

Another, more robust, strategy for synching is to provide a signal in which information in the data is redundant in the frequency domain. The receiver can look for a correlation in the data created by this repetition to synch up. The receiver could use this same technique to find correlations in the data from signals from multiple transmitters. In mathematical terms, the correlation between the repeated signal portion can be identified by fully complex convolution. Convolution inherently corrects for the asymmetry produced by the slope of the Nyquist band, so that the peak value occurs when the limits of integration exactly correspond to the beginning and the end of the repeated data segment (and it's negative time image).

Figure 2:
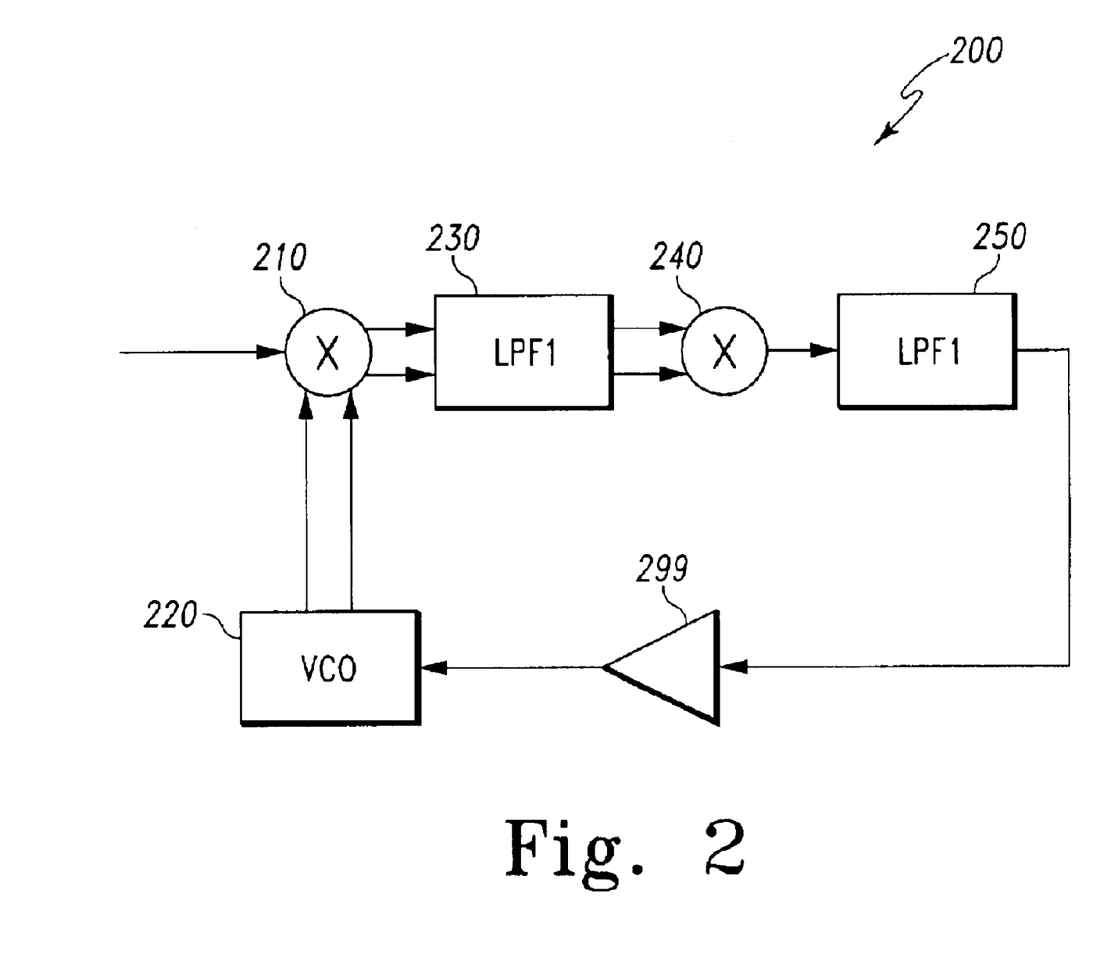
FIG. 2 is a prior art Costas loop.

A typical existing means for performing such a convolution is the Costas Loop, shown in FIG. 2. The Costas Loop operates on a complex signal, such as a QAM signal. As with the phase-lock loop, a first multiplier 210 multiplies the signal with the output of a VCO 220, though, as shown in FIG. 2, this is a complex multiplication, which produces both an I' and a Q' output. As with the phase-lock loop, the output of the first multiplier is passed through a low-pass filter 230 where the unwanted (frequency sum) portion of the multiplied signal is removed. The filtered I' and Q' are then multiplied by a second multiplier 240 to produce a beat note (assuming the sideband isn't balanced—otherwise it's merely a DC voltage.) The beat note is passed through a second low-pass filter 250, then amplified at 299 and returned to the VCO 220 to complete the feedback loop. Thus, the portion of the Costas loop following the second multiplier 240, which drives the convergence of the loop, is basically a phase-lock loop. Consequently, like the phase-lock loop, the Costas loop has the disadvantage of slow convergence.

Figure 3:
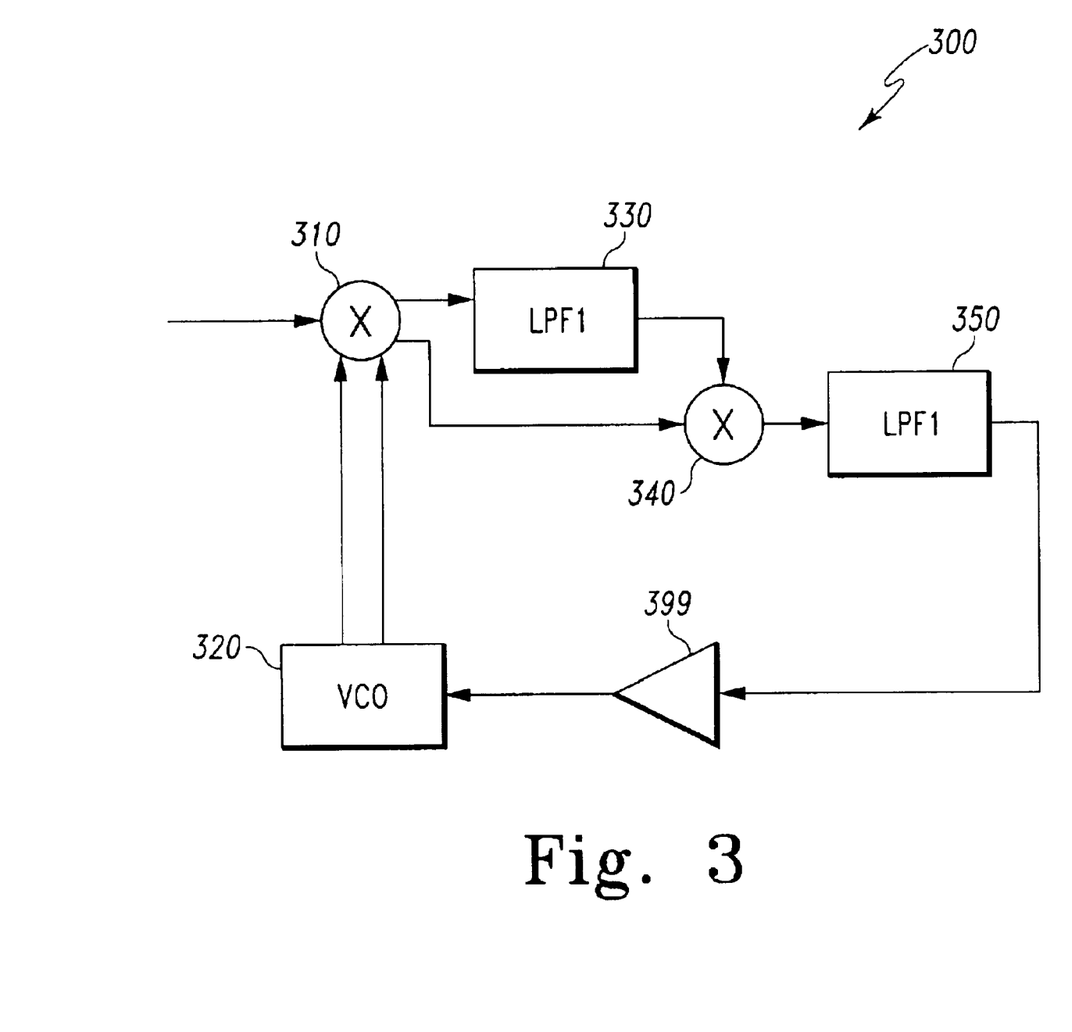
FIG. 3 is a prior art frequency-and-phase-lock loop.

A frequency-and-phase-lock loop ("FPLL") (shown in FIG. 3, and described in U.S. Pat. No. 4,072,909 to Citta, which is hereby incorporated by reference in its entirety) provides faster convergence. The FPLL has a first low-pass filter 330 and a second low-pass filter 350 which perform the function of the second low-pass filter 250 in the Costas loop, which separate the averaging and noise-elimination functions. Thus, the first low-pass filter 330 can have a relatively wide band pass, so that the FPLL can acquire even when the signal and initial VCO frequencies are off by as much as a factor of 1000. The second low-pass filter 350 can have a relatively narrow band-pass, in order to give good averaging during lock-up. The output of the second multiplier 340 is a rectified sine wave with a DC offset. The DC offset provides the direction information, rather than an integration of a distorted sine wave, which provides a much stronger response when the frequency difference is relatively large. The signal from the second filter 350 is amplified at 399 and returned to the VCO 320 to complete the feedback loop.

Figure 4:
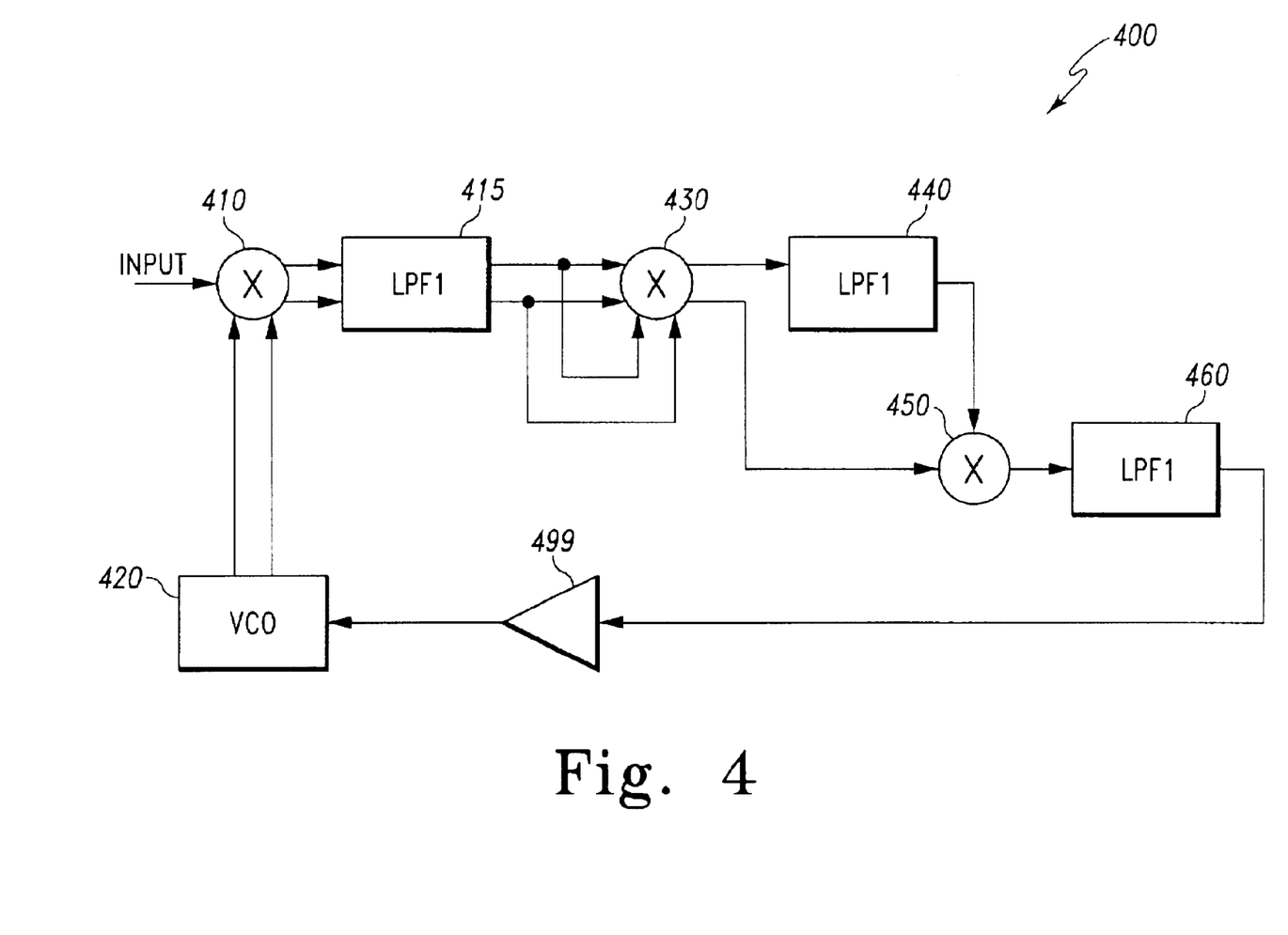
FIG. 4 is data-directed frequency-acquisition loop.

A data-directed frequency acquisition loop ("DDFL"), as disclosed in the concurrently-filed application, entitled Data-Directed Frequency Acquisition Loop, which is hereby incorporated in its entirety, and shown in FIG. 4, provides a data-synch loop which combines the desired features of the Costas Loop—synching by finding a correlation in repeated data through convolution—with the desired faster convergence of a frequency-and-phase-lock loop. The DDFL is indicated generally at 400. A first multiplier 410 multiplies the input signal by the output of a VCO 420. The output of the first multiplier 410 is filtered by a first low-pass filter 415, and the filtered output is squared by a second multiplier 430. The I component is filtered by a second low-pass filter 440, then multiplied by the Q component by a third multiplier 450. The output of the third multiplier 450 is filtered by a third low-pass filter 460, amplified at 499, and returned to the VCO 420 to complete the feedback loop.

As previously discussed, ghosting can create a series of perfect or near perfect nulls in the signal, especially in urban environments, which contain numerous reflective surfaces. Although the DDFL provides a robust mechanism for synching a receiver, it is possible for a ghost to destroy the portion of the signal containing the repeated data in the Nyquist slope.

Therefore, what is needed is a system and method for synching a digital receiver that has the advantages of the DDFL, but which is even more robust. The present invention is directed towards this need, among others.

DETAILED DESCRIPTION OF THE PREFERRED EMBODIMENT

For the purposes of promoting an understanding of the principles of the invention, reference will now be made to the embodiment illustrated in the drawings and specific language will be used to describe the same. It will nevertheless be understood that no limitation of the scope of the invention is thereby intended, and alterations and modifications in the illustrated device, and further applications of the principles of the invention as illustrated therein, are herein contemplated as would normally occur to one skilled in the art to which the invention relates.

A data-directed frequency-and-phase lock loop ("DDFPLL") according to the present invention provides even more robust acquisition than the DDFL, by simultaneously using signal redundancy in both Nyquist slopes in an offset-QAM signal to lock up. Furthermore, the DDFPLL provides a robust, continuous control signal. As with the DDFL, the DDFPLL combines desirable features of a Costas loop and a frequency-and-phase-lock loop; the DDFPLL synchs using redundancy of the data in the frequency domain, such as in a double sideband suppressed signal, but has an output that converges like the FPLL, and provides a control signal that is not disrupted by noise that displaces the signal phase by 90 degrees or less. Thus, the DDFPLL provides both highly robust frequency acquisition and highly robust phase-lock.

Figure 5:
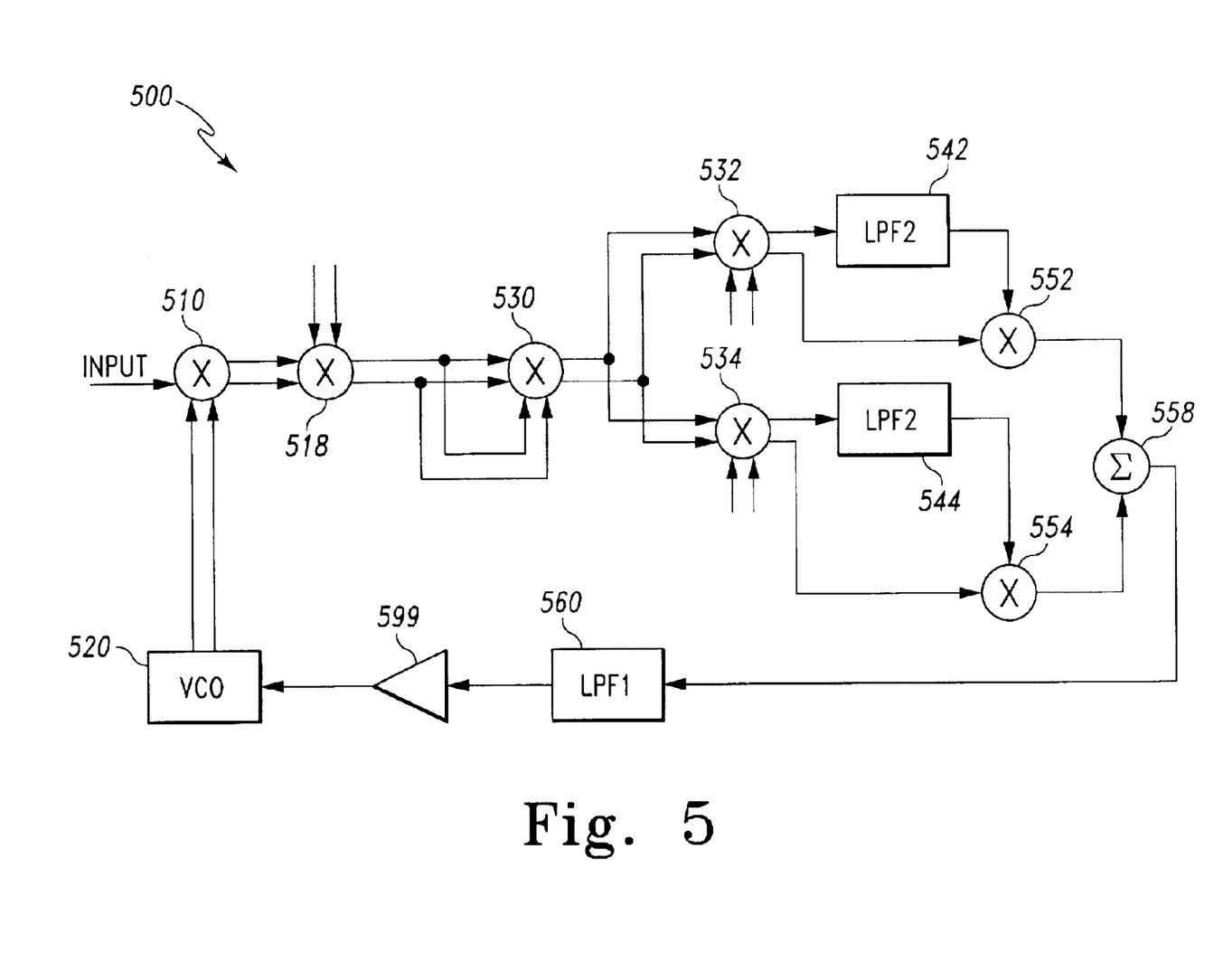
FIG. 5 is a data-directed frequency-and-phase lock loop according to the present invention.
Figure 6:
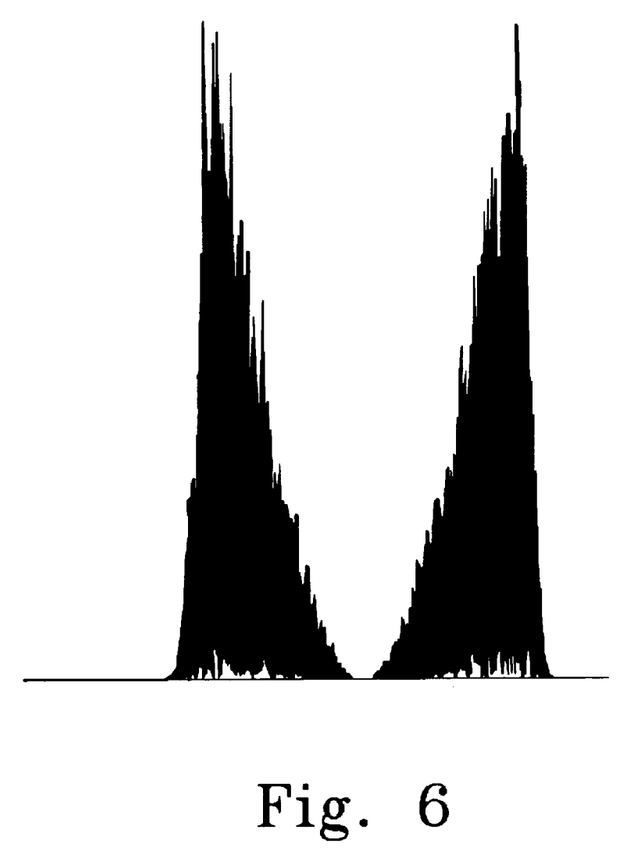
FIG. 6 is an example of a typical power spectrum of the output of a first multiplier in the data-directed frequency-and-phase lock loop of FIG. 5.

A preferred embodiment DDFPLL according to the present invention is shown in FIG. 5, and indicated generally at 500. The input signal and the output of a VCO 520 are multiplied by a first multiplier 510. FIG. 6 is an example of a typical power spectrum (in the frequency domain) of the output of the first multiplier 510. In order to separate the peaks generated by the correlation of the separate Nyquist slopes the output of the first multiplier is multiplied with a fixed frequency by a second multiplier 518. In the preferred embodiment this frequency is ¼ of the symbol rate, since this requires multiplication only by 1 and −1, and because it provides the maximum separation of the correlations of the two Nyquist slopes, but it will be appreciated that any frequency that results in shifting the distribution shown in FIG. 6 off the origin can theoretically be used.

Figure 7:
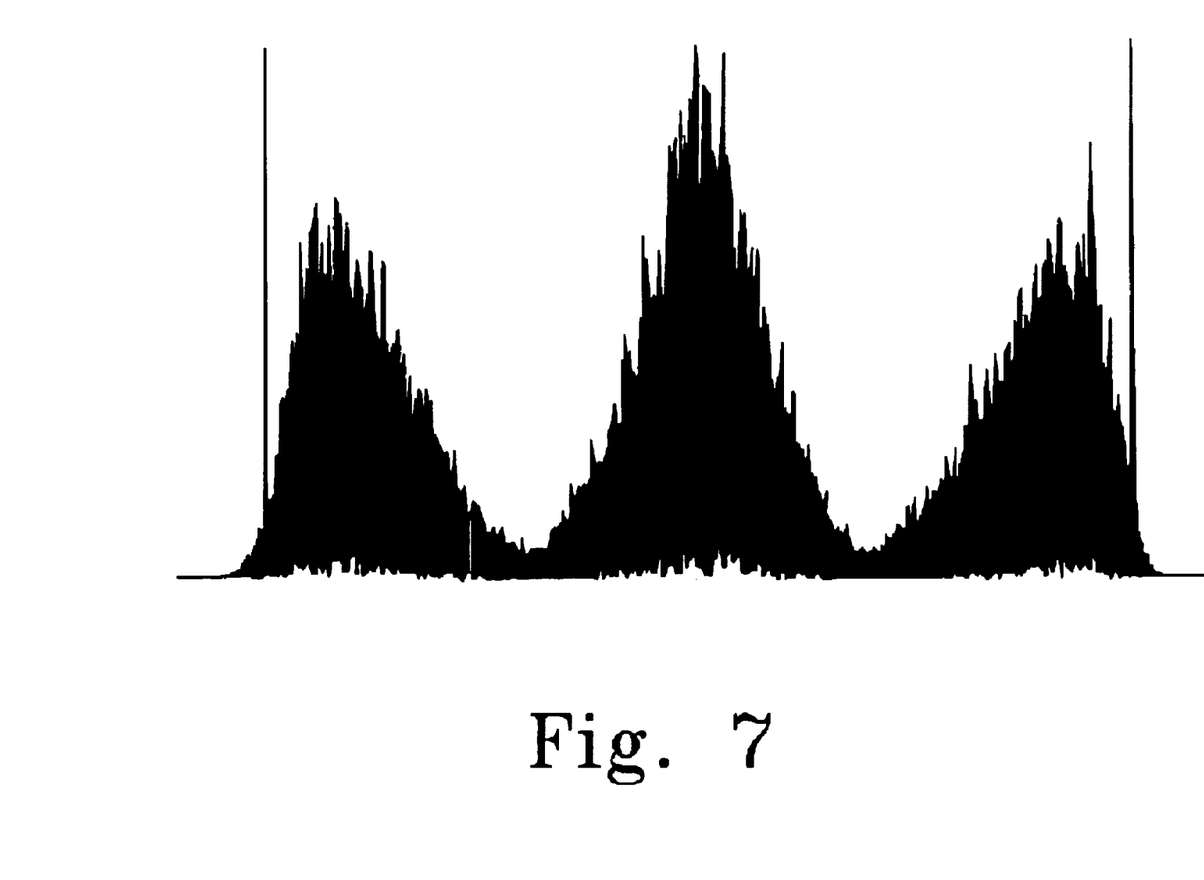
FIG. 7 is a typical power spectrum of the output of a third multiplier of the data-directed frequency-and-phase lock loop of FIG. 5, the third multiplier having the input illustrated in FIG. 6.

The output of the second multiplier 518 is convolved by a third multiplier 530. FIG. 7 is a typical power spectrum of the output of the third multiplier 530 corresponding to the input illustrated in FIG. 6 (assuming the second multiplier 518 shifted the origin to the center of one of the two peaks, by multiplying by ¼ of the symbol rate).

The output of the third multiplier 530 is used to synch up through a pair of frequency acquisition loops. The signal is sent to a fourth frequency-shift multiplier 532 and a fifth frequency-shift multiplier 534. In the preferred embodiment the frequency-shift generated by these multipliers are ¼ and ¾ of the symbol rate, but it will be appreciated that this is a function of the frequency shift imposed by the second multiplier. The difference between the fourth and fifth frequency-shift multipliers is ½ of the symbol frequency. In the preferred embodiment, the fourth multiplier shifts the spectrum shown in FIG. 7 such that the center of the first peak is at the origin, and the fifth multiplier shifts the spectrum shown in FIG. 7 such that the center of the third peak is at the origin. (The origin and f(s) are identical.)

The I portions (in phase) of the outputs of the frequency-shift multipliers 532 and 534 are filtered by low pass filters 542 and 544, and then multiplied by the corresponding Q (quadrature) portion of the outputs of the frequency-shift multipliers 532 and 534 by a sixth multiplier 552 and a seventh multiplier 554. The outputs of the sixth and seventh multipliers 552 and 554 are summed by a summer 558. The output of the summer 558 is filtered by a third low-pass filter 560, amplified at 599, and returned to the VCO 520 to complete the feedback loop.

It will be appreciated that the elements of the circuit shown in FIG. 5 can be substituted, permutated, or both, to produce a number of equivalent alternative embodiment circuits. For example, it will be appreciated that the amplifier 599 may actually be incorporated into the filter 560. Those skilled in the art will recognize that filters typically include amplification to offset reductions in signal strength caused by the filtering. It will be appreciated that the amplification could equivalently be performed by a separate amplifier, either prior to or after filtration.

Furthermore, the complex multipliers shown in FIG. 5 comprise a number of real multipliers organized to produce the complex product of QAM signals. The complex multipliers can be produced by a variety of sets and arrangements of subcomponents. Furthermore, the subcomponents can be reorganized or rearranged in a number of ways to produce the same mathematical result, as will be obvious to a person of ordinary skill in the art, and as is commonly done as a matter of circuit engineering.

It will likewise be appreciated that many of these real "multipliers" can actually be substantially simpler hardware components. For example, the VCO can simply produce a signal of oscillating 1 s and –1 s. In this case, the potential multiplication required by the multipliers comprising the first complex multiplier 510 is limited to a change of signs. Similarly, the two of the multipliers comprising the second multiplier 530 multiply the same input by itself. Thus, the range of possible outputs contains only half the possibilities of the domain of inputs. Consequently, this function can more easily be performed by a lookup table that provides the square of the input than by an actual multiplier, which requires many more gates. Other simplifications of the hardware are possible will be apparent to persons of ordinary skill in the art.

Comparing the circuit 500 with the circuit 400, it will be appreciated that the present invention comprises a pair of data-directed frequency acquisition loops, as disclosed in U.S. Provisional Patent Application No. 60/370,295. The phase-shift multipliers 518, 532, and 534 permit the two DDFLs to operate simultaneously, as described hereinabove, to detect redundancy in the data in each of the Nyquist slopes independently. When the response from one of the DDFLs is low due to a ghost that is destroying the redundancy in one of the Nyquist slopes, the overall response at the adder 558 is controlled by the response from the other of the DDFLs. Thus, no single ghost can prevent acquisition or destroy the phase-lock.

It will be appreciated that the circuit 500 can be adapted to provide symbol clock recovery, by replacing the summer 558 with a difference summer, and returning its signal to the symbol clock control rather than the VCO 520.

While the invention has been illustrated and described in detail in the drawings and foregoing description, the same is to be considered as illustrative and not restrictive in character, it being understood that only the preferred embodiment, and certain other embodiments deemed helpful in further explaining how to make or use the preferred embodiment, have been shown. All changes and modifications that come within the spirit of the invention are desired to be protected.

We claim:

1. A frequency acquisition and phase-lock loop having a symbol rate, and comprising:

a first input;

a VCO having an I and a Q outputs;

a first multiplier that receives as input the first input and the I and Q outputs, and which has an I' and a Q' outputs;

a second multiplier that multiplies the I' and Q' outputs by a first fixed frequency to produce an I" and Q" outputs;

a third multiplier that receives as input the I" and Q" outputs and convolves them to produce an I''' and Q''' outputs;

a fourth multiplier that receives at input the I''' and Q''' outputs and multiplies them by a second fixed frequency to produce a first I"" and Q"" outputs;

a fifth multiplier that receives at input the I''' and Q''' outputs and multiplies them by a third fixed frequency to produce a second I"" and Q"" outputs;

first and second low-pass filters that receive as input the first and second I"" outputs to produce a first and second filtered I"" outputs, respectively;

a sixth and seventh multipliers that receive as input the first and second Q"" outputs, respectively, and the first and second filtered I"" outputs, respectively, to produce a first and second response outputs, respectively;

a summer that receives as input the first and second response outputs to produce a combined response signal;

a third low-pass filter that receives as input the combined response signal to produce a filtered combined response signal;

wherein the filtered combined response signal is returned to the VCO to complete the feedback loop.

2. The frequency acquisition and phase-lock loop of claim 1, wherein the first fixed frequency is ¼ of the symbol rate.

3. The frequency acquisition and phase-lock loop of claim 1, wherein the second and third fixed frequencies differ by ½ of the symbol frequency.

4. The frequency acquisition and phase-lock loop of claim 3, wherein the second fixed frequency is ¼ of the symbol rate.

5. The frequency acquisition and phase-lock loop of claim 1, wherein the combined response signal is amplified before it is filtered.

6. The frequency acquisition and phase-lock loop of claim 1, wherein the filtered combined response signal is amplified before it is returned to the VCO.

7. A frequency acquisition and phase-lock loop having a symbol rate and comprising:

a first input;

a VCO having an I and a Q outputs;

a first multiplier that receives as input the first input and the I and Q outputs, and which has an I' and a Q' outputs;

a second multiplier that multiplies the I' and Q' outputs by ¼ the symbol rate to produce an I" and Q" outputs;

a third multiplier that receives as input the I" and Q" outputs and convolves them to produce an I'" and Q'" outputs;

a fourth multiplier that receives at input the I'" and Q'" outputs and multiplies them by ¼ of the symbol rate to produce a first I"" and Q"" outputs;

a fifth multiplier that receives at input the I'" and Q'" outputs and multiplies them by a ¾ of the symbol rate to produce a second I"" and Q"" outputs;

first and second low-pass filters that receive as input the first and second I"" outputs to produce first and second filtered I"" outputs, respectively;

a sixth and seventh multipliers that receive as input the first and second Q"" outputs, respectively, and the first and second filtered I"" outputs, respectively, to produce a first and second response outputs, respectively;

a summer that receives as input the first and second response outputs to produce a combined response signal;

a third low-pass filter that receives as input the combined response signal to produce a filtered combined response signal;

an amplifier that receives the filtered combined response signal to produce an amplified filtered combined response signal that is returned to the VCO to complete the feedback loop.

8. A frequency acquisition and phase-lock loop wherein data in two Nyquist slopes is convolved simultaneously to produce a feedback signal.

9. The frequency acquisition and phase-lock loop of claim 8, wherein the data in a first one of the two Nyquist slopes is convolved by a DDFL.

10. The frequency acquisition and phase-lock loop of claim 9, wherein the data in a second one of the two Nyquist slopes is convolved by a DDFL.

11. A symbol clock recovery loop for a symbol clock having a symbol clock control, the symbol clock recovery loop having a symbol rate and comprising:

a first input;

a VCO having an I and a Q outputs;

a first multiplier that receives as input the first input and the I and Q outputs, and which has an I' and a Q' outputs;

a second multiplier that multiplies the I' and Q' outputs by a first fixed frequency to produce an I" and Q" outputs;

a third multiplier that receives as input the I" and Q" outputs and convolves them to produce an I'" and Q'" outputs;

a fourth multiplier that receives at input the I'" and Q'" outputs and multiplies them by a second fixed frequency to produce a first I"" and Q"" outputs;

a fifth multiplier that receives at input the I'" and Q'" outputs and multiplies them by a third fixed frequency to produce a second I"" and Q"" outputs;

first and second low-pass filters that receive as input the first and second I"" outputs to produce a first and second filtered I"" outputs, respectively;

a sixth and seventh multipliers that receive as input the first and second Q"" outputs, respectively, and the first and second filtered I"" outputs, respectively, to produce a first and second response outputs, respectively;

a difference summer that receives as input the first and second response outputs to produce a difference response signal;

a third low-pass filter that receives as input the difference response signal to produce a filtered difference response signal;

wherein the filtered difference response signal is sent to the symbol clock control.

12. The frequency acquisition and phase-lock loop of claim 11, wherein the first fixed frequency is ¼ of the symbol rate.

13. The frequency acquisition and phase-lock loop of claim 11, wherein the second and third fixed frequencies differ by ½ of the symbol frequency.

14. The frequency acquisition and phase-lock loop of claim 13, wherein the second fixed frequency is ¼ of the symbol rate.

15. The frequency acquisition and phase-lock loop of claim 11, wherein the difference response signal is amplified before it is filtered.

16. The frequency acquisition and phase-lock loop of claim 11, wherein the filtered difference response signal is amplified before it is returned to the VCO.

* * * * *